(12) United States Patent
Zheng et al.

(10) Patent No.: US 11,848,277 B2
(45) Date of Patent: Dec. 19, 2023

(54) CONTROL MODULE, METHOD FOR MANUFACTURING SAME, AND ELECTRONIC DEVICE

(71) Applicant: BOE TECHNOLOGY GROUP CO., LTD., Beijing (CN)

(72) Inventors: Meizhu Zheng, Beijing (CN); Yuanyuan Li, Beijing (CN); Dalin Xiang, Beijing (CN); Jiuzhen Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 318 days.

(21) Appl. No.: 17/296,574

(22) PCT Filed: Aug. 21, 2020

(86) PCT No.: PCT/CN2020/110573
§ 371 (c)(1),
(2) Date: May 25, 2021

(87) PCT Pub. No.: WO2022/036705
PCT Pub. Date: Feb. 24, 2022

(65) Prior Publication Data
US 2023/0146838 A1    May 11, 2023

(51) Int. Cl.
*H01L 23/552* (2006.01)
*H01L 23/00* (2006.01)

(52) U.S. Cl.
CPC ............ *H01L 23/552* (2013.01); *H01L 24/32* (2013.01); *H01L 24/83* (2013.01); *H01L 2224/32225* (2013.01); *H01L 2224/831* (2013.01)

(58) Field of Classification Search
CPC .............. H01L 24/32; H01L 24/83; H01L 2224/32225; H01L 2224/831; H01L 23/552
USPC ............... 257/659, 414; 438/48, 49
See application file for complete search history.

(56) References Cited

U.S. PATENT DOCUMENTS

| | | | |
|---|---|---|---|
| 2006/0281229 A1* | 12/2006 | Koh | B29C 45/14647 257/E21.504 |
| 2007/0210392 A1* | 9/2007 | Sakakibara | B81C 1/0023 257/414 |
| 2009/0166830 A1* | 7/2009 | Li | H01L 23/04 257/E23.191 |
| 2017/0371449 A1* | 12/2017 | Hu | G06F 3/0447 |
| 2018/0182683 A1* | 6/2018 | Val | H01L 23/552 |
| 2019/0059159 A1 | 2/2019 | Deng | |

FOREIGN PATENT DOCUMENTS

| | | |
|---|---|---|
| CN | 101261558 A | 9/2008 |
| CN | 106158513 A | 11/2016 |
| CN | 111356308 A | 6/2020 |
| WO | 2017143556 A1 | 8/2017 |

* cited by examiner

*Primary Examiner* — Didarul A Mazumder
(74) *Attorney, Agent, or Firm* — Lippes Mathias LLP

(57) ABSTRACT

Provided is a control module including a printed circuit board, an IC, and a shielding cover. The shielding cover is provided with a dispensing hole for adhesive dispensing. The IC is soldered onto the printed circuit board, and an adhesive may be dispensed between the IC and the printed circuit board through the dispensing hole. A method for manufacturing a control module is also provided.

19 Claims, 5 Drawing Sheets

CONTROL MODULE, METHOD FOR MANUFACTURING SAME, AND ELECTRONIC DEVICE

CROSS-REFERENCE TO RELATED APPLICATIONS

This application is a 371 of PCT Application No. PCT/CN2020/110573, filed on Aug. 21, 2020, the disclosure of which is herein incorporated by reference in its entirety.

TECHNICAL FIELD

The present disclosure relates to the field of display technologies, and in particular, relates to a control module, a method for manufacturing the same, and an electronic device.

BACKGROUND

A control module is one of essential components of an electronic device. The control module generally includes a printed circuit board, an integrated circuit (IC) soldered onto the printed circuit board, and a shielding cover housing the IC. The shielding cover may shield interference caused by other electrical signals to the operation of the IC.

However, due to fall-off of solder for soldering IC, the IC cannot be effectively secured on the printed circuit board, which affects yield of the control module.

SUMMARY

The present disclosure provides a control module, a method for manufacturing the same, and an electronic device. The technical solutions are as follows.

In one aspect, a control module is provided. The control module includes: a printed circuit board; an integrated circuit (IC) disposed on the printed circuit board; and a shielding cover soldered onto the printed circuit board and housing the IC inside; wherein the shielding cover is provided with a dispensing hole for adhesive dispensing.

Optionally, the shielding cover includes a top plate and a side plate, wherein one end of the side plate is connected to the top plate and the other end of the side plate is soldered to the printed circuit board, and the dispensing hole is disposed in the top plate.

Optionally, an orthographic projection of the dispensing hole on the printed circuit board is overlapped with an orthographic projection of the IC on the printed circuit board.

Optionally, the dispensing hole is in the shape of a circle, a square, or a rhombus.

Optionally, the shielding cover is also provided with an observation hole for observation.

Optionally, an orthographic projection of the IC on the printed circuit board is in the shape of a rectangle, and orthographic projections of the observation hole and the dispensing hole on the printed circuit board fall on two opposite sides or at two opposite corners of the rectangle.

Optionally, the control module further includes a shielding film covering an opening, wherein the opening includes the dispensing hole.

Optionally, an orthographic projection of the opening on the printed circuit board is within an orthographic projection of the shielding film on the printed circuit board.

Optionally, the shielding cover is provided with at least one rectangular surface, and a plurality of openings formed in a same rectangular surface; wherein a plurality of shielding films are provided, which cover the openings, and the openings one-to-one corresponds to the shielding films; or, one shielding film is provided, which covers the openings.

Optionally, a material of the shielding film includes a flexible metal material, wherein a thickness of the flexible metal material is less than a thickness threshold.

Optionally, a material of the shielding film includes a metal material.

Optionally, the printed circuit board includes a flexible printed circuit FPC; and the IC includes a touch IC.

Optionally, an adhesive used in the adhesive dispensing includes a hot-melt adhesive.

Optionally, the adhesive dispensing includes: dispensing the adhesive between the printed circuit board and the IC to bond the printed circuit board and the IC.

In another aspect, a method for manufacturing a control module is provided. The method is applicable to manufacturing the control module as described in the above aspect. The method includes: providing a printed circuit board; arranging an IC on the printed circuit board; soldering a shielding cover onto the printed circuit board, the shielding cover housing the IC inside and being provided with a dispensing hole for adhesive dispensing; and dispensing an adhesive between the IC and the printed circuit board through the dispensing hole.

In yet another aspect, an electronic device is provided. The electronic device includes a base substrate, and the control module as described in the above aspect, wherein the control module is disposed on the base substrate.

BRIEF DESCRIPTION OF THE DRAWINGS

For clearer illustration of the technical solutions in the embodiments of the present disclosure, accompanying drawings required for describing the embodiments are briefly introduced hereinafter. Apparently, the accompanying drawings described hereinafter merely illustrate some embodiments of the present disclosure, and those ordinary skilled in the art may derive other drawings from these accompanying drawings without creative efforts.

DETAILED DESCRIPTION

For clearer descriptions of the objectives, technical solutions and advantages of the present disclosure, embodiments of the present disclosure are described in detail hereinafter with reference to the accompanying drawings.

Currently, an IC in a control module is directly soldered onto a printed circuit board to be bonded with the printed circuit board. Under such bonding, the IC may detach from the printed circuit board in some scenarios, further resulting in failure of the IC. For example, in a whole-device drop test or falling-ball test of an electronic device before delivery from factory, solder for soldering an IC of a control module onto a printed circuit board of the electronic device may fall off causing the IC to detach from the printed circuit board. The whole-device drop test is an experiment of controlling the electronic device to drop from a certain height; and the falling-ball test is an experiment of dropping a ball onto the electronic device from a certain height away from the electronic device.

A control module is provided in an embodiment of the present disclosure. An IC and a printed circuit board of the control module may be firmly bonded, and yield of the control module is relatively high.

Figure 1:
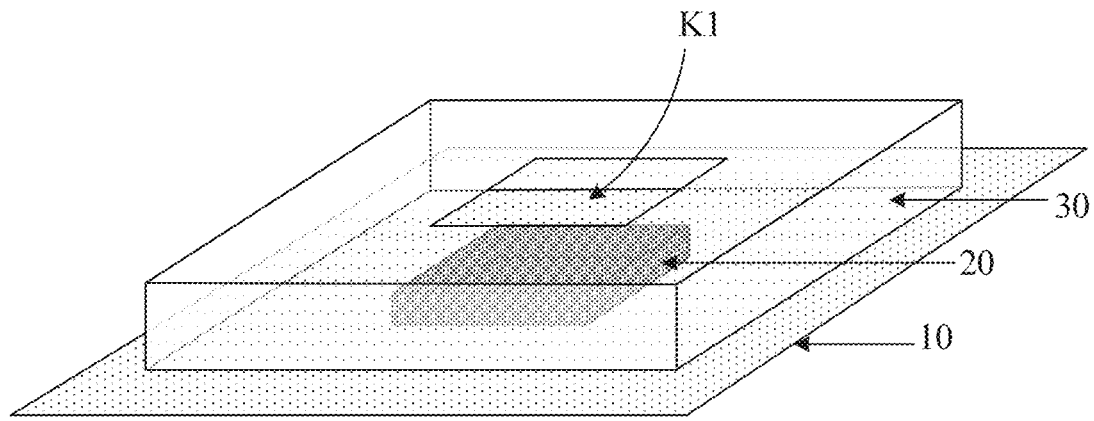
FIG. 1 is a schematic structural diagram of a control module according to an embodiment of the present disclosure.
Figure 2:
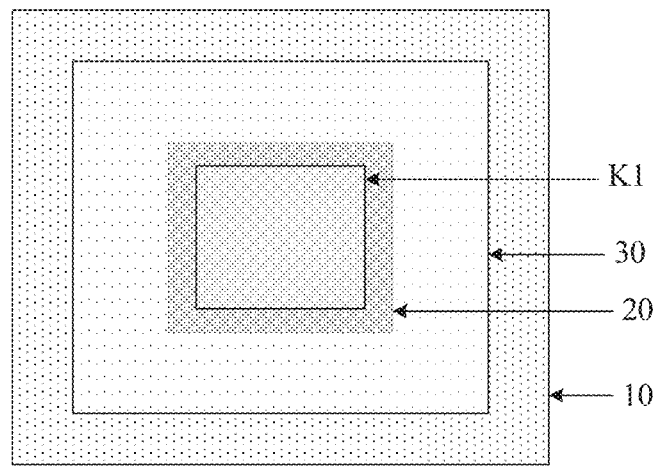
FIG. 2 is a top view of a control module according to an embodiment of the present disclosure.

FIG. 1 is a schematic structural diagram of a control module according to an embodiment of the present disclosure. FIG. 2 is a top view of the control module shown in FIG. 1. Referring to FIG. 1 and FIG. 2, the control module may include: a printed circuit board 10, an IC 20 disposed on the printed circuit board 10, and a shielding cover 30 soldered onto the printed circuit board 10 and housing the IC 20 inside.

Optionally, the IC 20 being disposed on the printed circuit board 10 may indicate that the IC 20 is soldered onto the printed circuit board 10 by a soldering process.

The term "housing" may be understood as the shielding cover 30 wrapping the IC 20 inside. In this way, interference caused by other external electrical signals to the operation of the IC 20 can be effectively shielded, that is, the operating reliability of the IC 20 is ensured.

Figure 3:
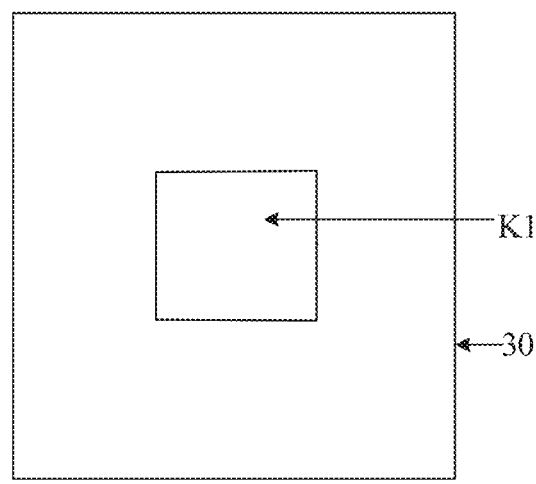
FIG. 3 is a top view of a shielding cover according to an embodiment of the present disclosure.

Optionally, FIG. 3 is a top view of a shielding cover according to an embodiment of the present disclosure. As seen from FIGS. 1 to 3, the shielding cover 30 according to the embodiment of the present disclosure may be provided with a dispensing hole K1 for adhesive dispensing. The adhesive dispensing may be interpreted or understood as dispensing (or, may also be interpreted as dropping) an adhesive between the printed circuit board 10 and the IC 20. That is, in the embodiment of the present disclosure, the adhesive may be dispensed between the printed circuit board 10 and the IC 20 through the dispensing hole K1 of the shielding cover 30 to reliably bond the printed circuit board 10 and the IC 20. In this way, even if solder that solders the IC 20 and the printed circuit board 10 falls off, the IC 20 may still be effectively secured on the printed circuit board 10. That is, the IC 20 and the printed circuit board 10 may be reliably bonded.

Optionally, the dispensing hole K1 may allow the adhesive to run through. That is, the adhesive may be dropped from the outside of the shielding cover 30 through the dispensing hole K1 directly into the shielding cover 30, and dropped between the printed circuit board 10 and the IC 20. Correspondingly, the size of the dispensing hole K1 should be at least greater than the size of each drop of the adhesive.

Alternatively, the dispensing hole K1 may allow a dispensing end of a dispensing device to pass through. That is, the dispensing end of the dispensing device may enter the shielding cover 30 through the dispensing hole K1, and drop the adhesive between the printed circuit board 10 and the IC 20. Correspondingly, the size of the dispensing hole K1 should be greater than the size of the dispensing end. For example, assuming that the dispensing hole K1 is circular and the dispensing end is cylindrical or conical, then a diameter of the circular dispensing hole K1 should be greater than a diameter of the dispensing end.

Relative to directly dropping the adhesive between the printed circuit board 10 and IC 20 through the dispensing hole K1, dispensing the adhesive between the printed circuit board 10 and the IC 20 through the dispensing hole K1 by the dispensing end of the dispensing device can prevent adhesive splashing, ensure an accurate dispensing position, and improve dispensing accuracy. Therefore, in order to ensure the dispensing accuracy, the control module is schematically illustrated in the following embodiments of the present disclosure by taking the dispensing hole K1 allowing the dispensing end of the dispensing device to pass through as an example.

In summary, the embodiment of the present disclosure provides a control module, which includes a printed circuit board, an IC, and a shielding cover, wherein the shielding cover is provided with a dispensing hole for adhesive dispensing. With the IC being soldered onto the printed circuit board, the adhesive may be dispensed between the IC and the printed circuit board through the dispensing hole, such that the IC can be effectively secured on the printed circuit board by soldering and adhesive bonding. The yield of the control module is improved.

In addition, the shielding cover included in the control module in the related art is not provided with dispensing holes or any other openings. Adhesive dispensing can only be performed before soldering the shielding cover. With this operation sequence, an adhesive being dispensed between the IC and the printed circuit board may melt under a soldering temperature (usually 220° C.) during soldering the shielding cover, causing the IC to detach from the printed circuit board in certain scenarios due to fall-off of solder. Therefore, in the related art, either the shielding cover is arranged only, or the adhesive dispensing is performed only. However, the shielding cover 30 is provided with a dispensing hole for the adhesive dispensing in the embodiment of the present disclosure. That is, the adhesive is dispensed between the printed circuit board 10 and the IC 20 through the dispensing hole K1 of the shielding cover 30 in the embodiment of the present disclosure. Thus, the adhesive can be further dispensed between the printed circuit board 10 and the IC 20 through the dispensing hole K1 with the shielding cover 30 being soldered. In this way, the phenomenon that the adhesive melts due to a soldering temperature caused by soldering the shielding cover 30 with the adhesive being dispensed first is effectively avoided. That is, influence of soldering a shielding cover on the dispensed adhesive is effectively avoided, such that the IC can be effectively secured on the printed circuit board, and the yield of the control module is improved.

Optionally, the shielding cover 30 described in the embodiment of the present disclosure may be a hemispherical structure with a cavity and with an opening on one side thereof, or may also be a prism with a cavity and with an opening on one side thereof. Referring to FIGS. 1 to 3 and the schematic structural diagram of a shielding cover shown in FIG. 4, it can be seen that the shielding cover 30 may include a top plate 301 and a side plate 302, wherein one end of the side plate 302 may be connected to the top plate 301, and the other end of the side plate 302 may be soldered onto the printed circuit board 10. Optionally, the top plate 301 and the printed circuit board 10 may be arranged in parallel.

In an exemplary embodiment, the shielding cover 30 may include a top plate 301 and a plurality of side plates 302. For example, the shielding cover 30 may be a quadrangular prism with a cavity and with an opening on one side. For example, the shielding cover 30 shown in FIGS. 1 to 4 includes a top plate 301 and four side plates 302. That is, the shielding cover 30 shown in FIGS. 1 to 4 is a cuboid. The control module is illustrated by taking the shielding cover 30 being a cuboid as an example in the embodiments of the present disclosure described hereinafter.

Optionally, where both of the shielding cover 30 and the IC 20 are cuboid structures, the shielding cover 30 may have a length greater than a length of the IC 20 and less than a length threshold, a width greater than a width of the IC 20 and less than a width threshold, and a height greater than a height of the IC 20 and less than a height threshold, to facilitate a miniaturized design of an electronic device, ensure that the shielding cover 30 completely houses the IC 20, and prevent the shielding cover 30 from contacting the IC 20 and affecting the operation of the IC 20.

Figure 4:
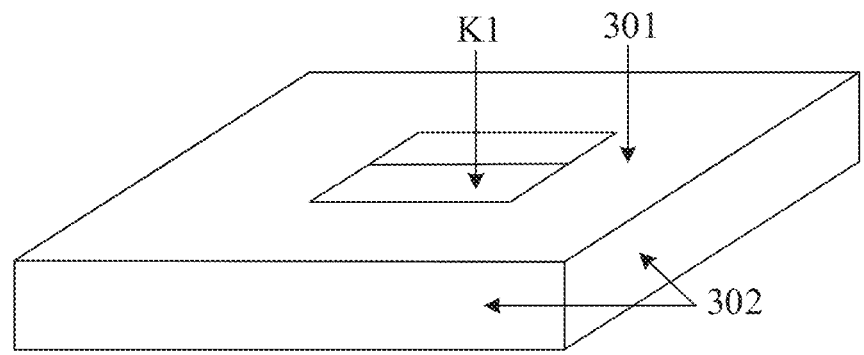
FIG. 4 is a schematic structural diagram of a shielding cover according to an embodiment of the present disclosure.
Figure 5:
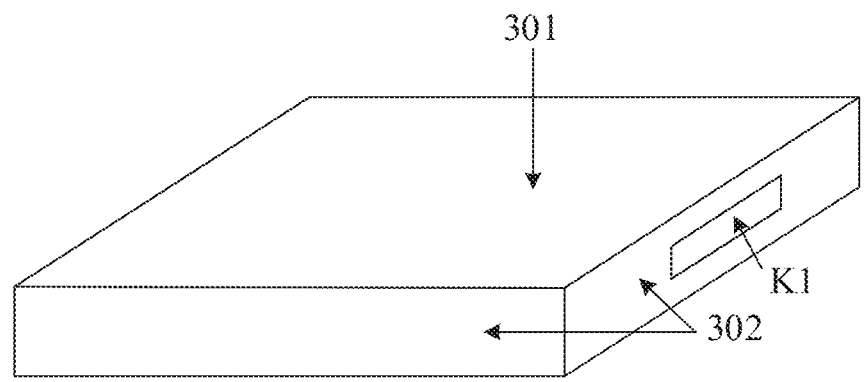
FIG. 5 is a schematic structural diagram of another shielding cover according to an embodiment of the present disclosure.

Optionally, as shown in FIG. 1 and FIG. 4, the dispensing hole K1 described in the embodiment of the present disclosure may be disposed in the top plate 301. Alternatively, as a schematic structural diagram of another shielding cover shown in FIG. 5, the dispensing hole K1 may be disposed in a side plate 302. For example, the dispensing hole K1 shown in FIG. 5 is disposed in the side plate 302 on a right side of the shielding cover.

By disposing the dispensing hole K1 in the top plate 301, on the premise of not adjusting a placement position of the control module, the adhesive may be reliably and smoothly dispensed between the IC 20 and the printed circuit board 10 under the effect of gravity, wherein the dispensing hole K1 allows the adhesive to run through. That is, the dispensing accuracy can be ensured.

Optionally, an orthographic projection of the dispensing hole K1 on the printed circuit board 10 may be overlapped with an orthographic projection of the IC 20 on the printed circuit board 10 in the embodiment of the present disclosure.

For example, referring to FIG. 1, the orthographic projection of the dispensing hole K1 on the printed circuit board 10 may be coincident with the orthographic projection of the IC 20 on the printed circuit board 10. That is, the size of the dispensing hole K1 may be the same as the size of the IC 20. In this way, the adhesive can be reliably dispensed between the IC 20 and the printed circuit board 10 in one time. Referring to the schematic structural diagram of another control module shown in FIG. 6, the orthographic projection of the dispensing hole K1 on the printed circuit board 10 may be only partially overlapped with the orthographic projection of the IC 20 on the printed circuit board 10.

Figure 6:
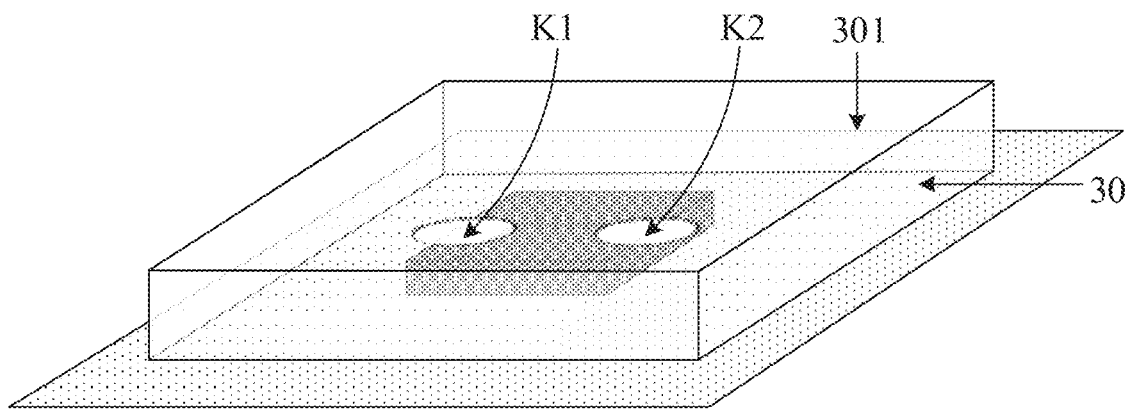
FIG. 6 is a schematic structural diagram of another control module according to an embodiment of the present disclosure.

Optionally, the dispensing hole K1 may be in the shape of a circle, a square or a rhombus in the embodiment of the present disclosure. For example, a square dispensing hole K1 is shown in FIGS. 1 to 5. A circular dispensing hole K1 is shown in FIG. 6. The circular dispensing hole is more convenient for the adhesive to run through and prevents the adhesive from sticking to the edge of the dispensing hole.

Referring to FIG. 6 again, the shielding cover 30 may be provided with an observation hole K2 for observation in the embodiment of the present disclosure. That is, during the adhesive dispensing through the dispensing hole K1, the adhesive dispensing may be observed through the observation hole K2, such that dispensing-related parameters may be adjusted in real time during the observation. For example, a dispensing position or a dispensing amount can be adjusted. In this way, the dispensing accuracy can be further improved, that is, the yield of the control module can be further ensured.

Optionally, referring to FIGS. 1 to 6, the orthographic projection of the IC 20 on the printed circuit board 10 may be in the shape of a rectangle. In this case, as shown in FIG. 6, orthographic projections of the observation hole K2 and the dispensing hole K1 on the printed circuit board 10 fall on two opposite sides or at two opposite corners of the rectangle. In addition, a distance between the observation hole K2 and the dispensing hole K1 may be set to be greater than a specified distance threshold, such that the adhesive dispensing can be effectively viewed through the observation hole K2.

For example, assuming that a boundary of the orthographic projection of the IC 20 on the printed circuit board 10 is an axisymmetric pattern, the orthographic projection of the dispensing hole K1 on the printed circuit board 10 and the orthographic projection of the observation hole K2 on the printed circuit board 10 may respectively fall on two sides of a symmetry axis of the axisymmetric pattern. In this way, during the adhesive dispensing through the dispensing hole K1 in one direction, the adhesive dispensing may be observed through the observation hole K2 in another direction. It is convenient for observation.

Taking the axisymmetric pattern being a rectangle as an example, in an optional exemplary embodiment, referring to FIG. 6, the orthographic projection of the dispensing hole K1 on the printed circuit board 10 and the orthographic projection of the observation hole K2 on the printed circuit board 10 may respectively fall on two opposite sides of the rectangle and be symmetrical with respect to one symmetry axis of the rectangle. In an exemplary embodiment, the center of the orthographic projection of the dispensing hole K1 on the printed circuit board 10 and the center of the orthographic projection of the observation hole K2 on the printed circuit board 10 are respectively coincident with the midpoints of the two opposite sides of the rectangle. In this way, in response to performing the adhesive dispensing through the dispensing hole K1 in one direction, observation can be performed through the observation hole K2 in another direction being symmetric with the one direction. It is convenient for observation.

In another optional exemplary embodiment, the orthographic projection of the dispensing hole K1 on the printed circuit board 10 and the orthographic projection of the observation hole K2 on the printed circuit board 10 may respectively fall at two opposite corners of the rectangle and on two sides of one symmetry axis of the rectangle. In an exemplary embodiment, the center of the orthographic projection of the dispensing hole K1 on the printed circuit board 10 and the center of the orthographic projection of the observation hole K2 on the printed circuit board 10 are respectively coincident with the vertexes of the two opposite corners of the rectangle. In response to performing adhesive dispensing through the dispensing hole K1 in one direction, the adhesive dispensing may be observed through the observation hole K2 in another direction diagonal to the one direction. It is convenient for observation.

Optionally, the shielding cover 30 may include a plurality of dispensing holes K1 to improve the dispensing efficiency in the embodiment of the present disclosure. Accordingly, the shielding cover 30 may also include a plurality of observation holes K2 to realize reliable observation of adhesive dispensing performed through respective dispensing holes K1. In addition, the dispensing holes K1 may one-to-one correspond to the observation holes K2. For example, orthographic projections of the dispensing hole and the corresponding observation hole in each group on the printed circuit board are symmetrical with respect to a symmetry axis M of the axisymmetric pattern. The number of dispensing holes K1 and the number of observation holes K2 are not limited in the embodiments of the present disclosure.

Figure 7:
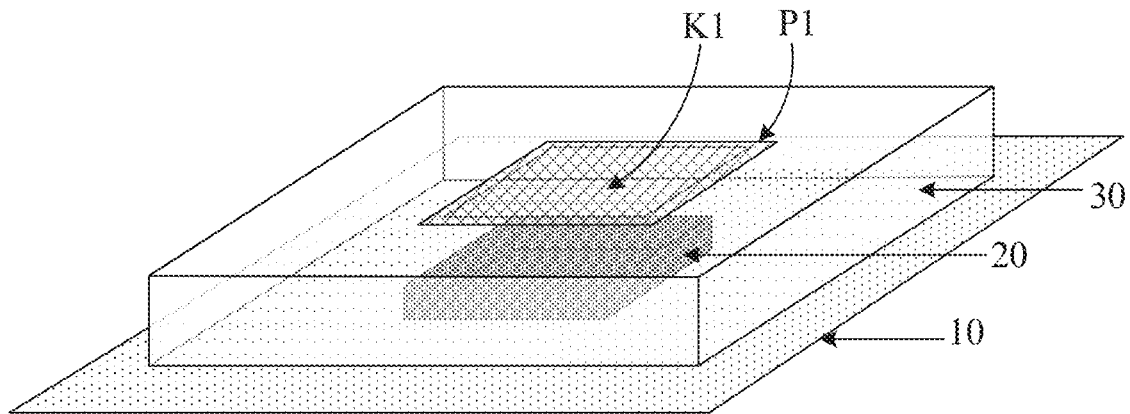
FIG. 7 is a schematic structural diagram of yet another control module according to an embodiment of the present disclosure.

FIG. 7 is a schematic structural diagram of yet another control module according to an embodiment of the present disclosure. As shown in FIG. 7, the control module may further include a shielding film P1 covering an opening. Optionally, the opening may include a dispensing hole K1 shown in FIG. 7.

Figure 8:
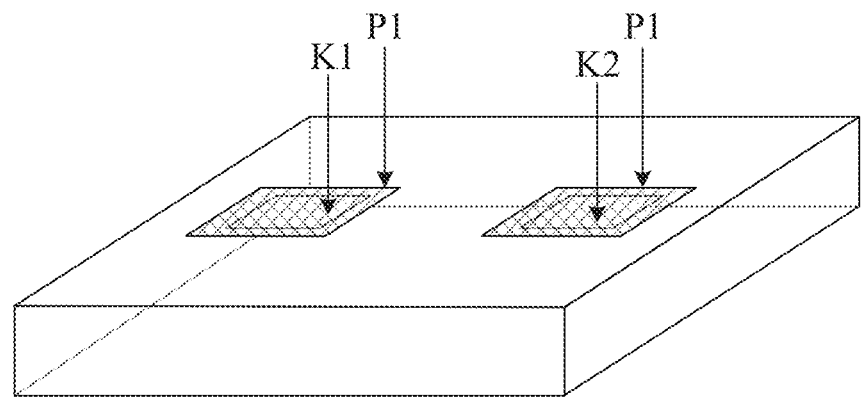
FIG. 8 is a schematic structural diagram of yet another shielding cover according to an embodiment of the present disclosure.
Figure 9:
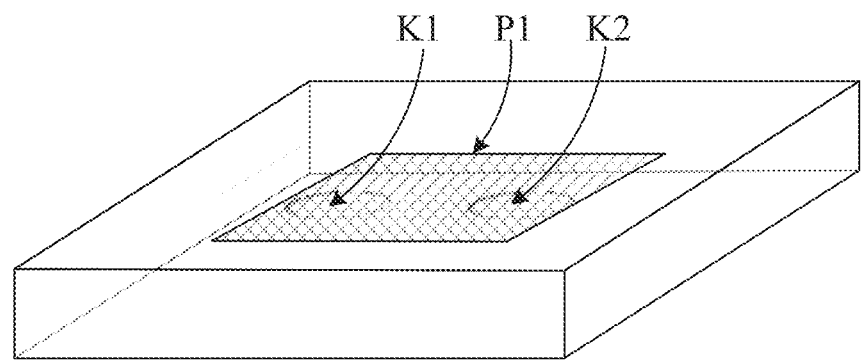
FIG. 9 is a schematic structural diagram of still another shielding cover according to an embodiment of the present disclosure.

If the shielding cover 30 further includes an observation hole K2, the opening may also include the observation hole K2. That is, referring to FIGS. 6, 8, and 9, the shielding cover 30 may be provided with a plurality of openings (for example, one dispensing hole K1 and one observation hole K2) disposed in the same rectangular surface. The rectangular surface may be a surface of the top plate 301 of the shielding cover 30 or a surface of any side plate 302 of the shielding cover 30. Accordingly, referring to FIG. 8, a plurality of shielding films P1 may be provided, which may cover a plurality of openings and one-to-one correspond to the openings, that is, one opening is covered with one shielding film P1. Alternatively, referring to FIG. 9, one shielding film P1 may be provided, which may cover a plurality of openings. For example, two openings in the surface of the top plate 301 are shown in FIG. 8 and FIG. 9, and accordingly, two shielding films P1 are shown in FIG. 8. Optionally, the shielding film P1 can cover the opening by adhesion or pressing.

By covering the shielding film P1 on the opening, other external electrical signals can be further effectively prevented from entering the shielding cover 30 through the opening and causing interference to the operation of the IC 20. The shielding film also exerts a dust-proof effect.

Optionally, an orthographic projection of the opening on the printed circuit board 10 may be within an orthographic projection of the shielding film on the printed circuit board 10. That is, referring to FIGS. 7 to 9, the size of the opening may be greater than the size of the shielding film P1, and the opening may be completely covered by the shielding film P1. In this way, other external electrical signals may be reliably shielded.

Optionally, the observation hole K2 may be in the shape of a square as shown in FIG. 8, or may be in the shape of a circle as shown in FIG. 9. The observation hole K2 may also be in other shapes, such as a rhombus.

Optionally, a material of the shielding film P1 may be a flexible metal material, a thickness of the flexible metal material being less than a thickness threshold. That is, the shielding film P1 may be made of a thinner and softer material. In this way, it is possible to prevent the control module from occupying a large space of the electronic device, contributing to the miniaturized design of the electronic device.

Optionally, a material of the shielding film 30 may be a metal material. That is, the shielding cover 30 may be a metal shielding cover being grounded.

Optionally, the printed circuit board 10 may be a flexible printed circuit (FPC). The printed circuit board 10 may be in the shape of a rectangle as shown in the accompanying drawings, and may also be in the other shapes, such as a circle. The IC 20 may be a touch IC, and accordingly, the control module may be a touch module. The touch module may drive an electronic device to implement a touch function. Alternatively, the IC 20 may be a display control IC, and accordingly, the control module may be a timing controller or a source driver chip, wherein the control module may be configured to drive a display screen of the electronic device to implement a display function.

Optionally, the adhesive used for the adhesive dispensing may be hot-melt adhesive in the embodiment of the present disclosure. In addition, the adhesive may also be an underfill adhesive because the adhesive is dispensed between the IC 20 and the printed circuit board 10.

Figure 10:
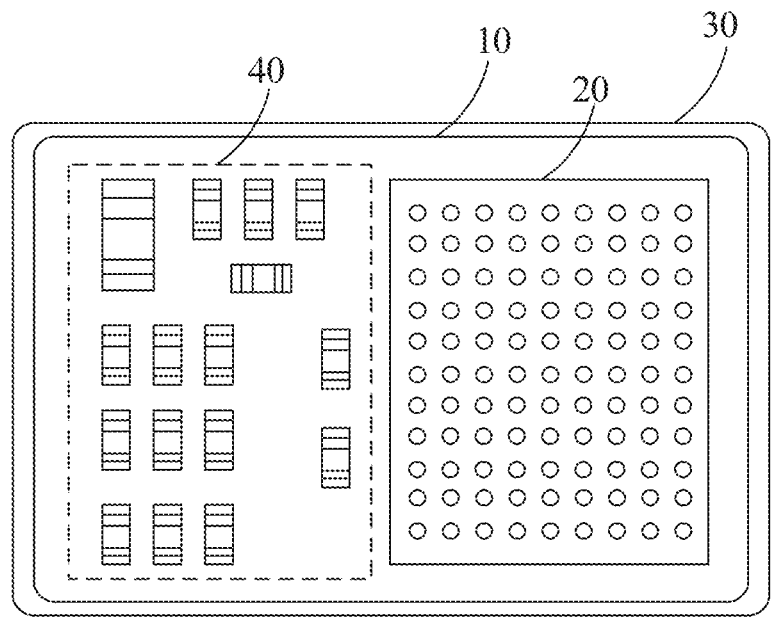
FIG. 10 is a top view of still another control module according to an embodiment of the present disclosure.

Optionally, FIG. 10 is a schematic top view of still another control module according to an embodiment of the present disclosure. The top plate of the shielding cover is removed in FIG. 10 for ease of viewing. As shown in FIG. 10, in addition to the IC 20, the control module generally includes other electronic components 40 (for example, a resistor, a capacitor, and/or an inductor) configured to provide electrical signals to the IC 20. The shielding cover 30 houses not only the IC 20, but also the other electronic components 40. Moreover, the size of the printed circuit board 10 shown in the accompanying drawing is only schematic and illustrative, and the illustration does not mean that the size of the printed circuit board 10 should be greater than the size of the shielding cover 30.

In summary, the embodiment of the present disclosure provides a control module, which includes a printed circuit board, an IC, and a shielding cover, wherein the shielding cover is provided with a dispensing hole for adhesive dispensing. With the IC being soldered onto the printed circuit board, the adhesive may be dispensed between the IC and the printed circuit board through the dispensing hole, such that the IC can be effectively secured on the printed circuit board by soldering and adhesive bonding. The yield of the control module is improved.

Figure 11:
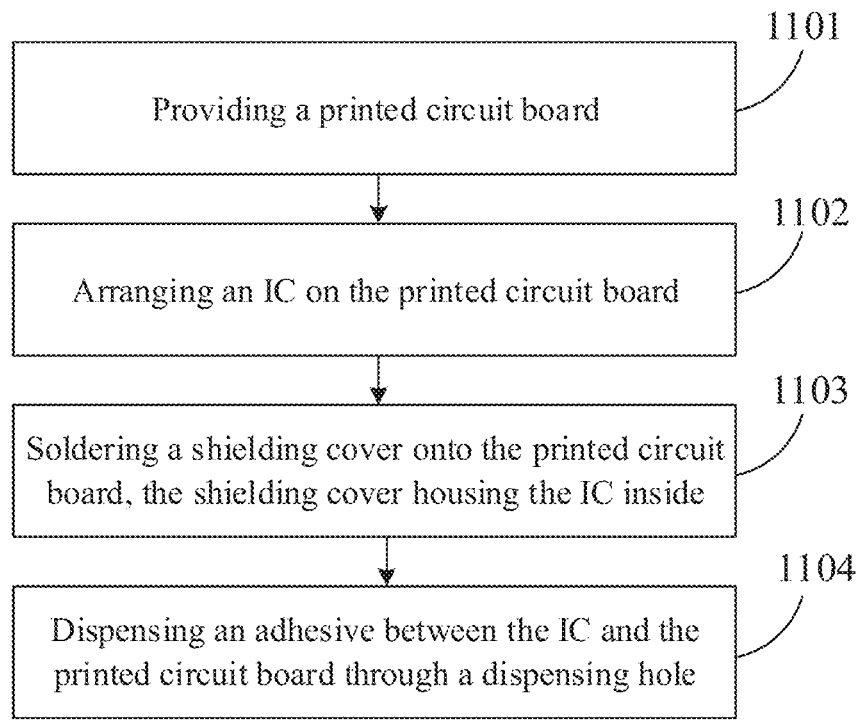
FIG. 11 is a flowchart of a method for manufacturing a control module according to an embodiment of the present disclosure.

FIG. 11 is a flowchart of a method for manufacturing a control module according to an embodiment of the present disclosure. The method may be intended to manufacture the control module as shown in the above accompanying drawings. Referring to FIG. 11, the method may include the steps described hereinafter.

In 1101, a printed circuit board is provided.

Optionally, the printed circuit board may be an FPC.

In 1102, an IC is arranged on the printed circuit board.

Optionally, the IC may be soldered onto the printed circuit board by a soldering process. The process involved in 1102 may be interpreted as a surface mounted technology (SMT).

In 1103, a shielding cover housing the IC inside is soldered onto the printed circuit board.

The shielding cover may be provided with a dispensing hole for adhesive dispensing. Optionally, the dispensing hole may be formed in the shielding cover by laser cutting before the shielding cover is soldered onto the printed circuit board. In this way, the problem that the forming accuracy cannot be ensured because the dispensing hole is formed after the shielding cover is soldered may be addressed.

In 1104, an adhesive is dispensed between the IC and the printed circuit board through the dispensing hole.

The adhesive may be dispensed between the IC and the printed circuit board through the dispensing hole in response to soldering the shielding cover.

Optionally, the adhesive may be directly dropped into the shielding cover through the dispensing hole, and dropped between the IC and the printed circuit board. Alternatively, a dispensing end of a dispensing device may enter the shielding cover through the dispensing hole, such that the adhesive may be dispensed between the IC and the printed circuit board by the dispensing end.

In response to dispensing the adhesive, the adhesive may be cured by a curing process (e.g., ultraviolet light irradiation) to ensure that the IC and the printed circuit board are reliably bonded by the adhesive.

In summary, the embodiment of the present disclosure provides a method for manufacturing a control module. By this method, the adhesive may be dropped between the IC and the printed circuit board through the dispensing hole of the shielding cover, in response to soldering the shielding cover housing the IC inside onto the printed circuit board. Therefore, the IC can be effectively secured on the printed circuit board by soldering and adhesive bonding. The yield of the control module is improved.

Optionally, the shielding cover may include a top plate and a side plate, one end of the side plate being connected to the top plate and the other end of the side plate being soldered to the printed circuit board. Therefore, a dispensing hole may be formed in the top plate or the side plate of the shielding cover.

Optionally, with reference to the orthographic projection of the IC on the printed circuit board, the adhesive dispensing hole may be formed at a position where the top plate of the shielding cover is overlapped with the orthographic projection of the IC on the printed circuit board, to ensure the dispensing accuracy and the dispensing efficiency.

Optionally, the formed dispensing hole may be in the shape of a circle, a square or a rhombus.

Optionally, an observation hole for observation may be formed in the shielding cover before the shielding cover is soldered to the printed circuit board, to facilitate observation of the adhesive dispensing and further improve the dispensing accuracy. In addition, if the orthographic projection of the IC on the printed circuit board is in the shape of a rectangle, orthographic projections of the observation hole and the dispensing hole on the printed circuit board may fall on two opposite sides or at two opposite corners of the rectangle.

Optionally, a shielding film may cover the opening of the shielding cover upon step 1104 to prevent other external electrical signals from entering the shielding cover through an opening (including the dispensing hole and the observation hole) and affecting the operation of the IC. For example, the shielding film may cover the opening by adhesive bonding, that is, the shielding film can be adhered onto the opening with viscous adhesive. Alternatively, the shielding film may be pressed on the opening by pressing.

Optionally, a shielding film having a size greater than the size of the opening may completely cover the opening to further ensure the shielding reliability. That is, an orthographic projection of the opening on the printed circuit board is caused to be within an orthographic projection of the shielding film on the printed circuit board.

Optionally, each opening may be covered with one shielding film in response to a plurality of openings being formed on the same rectangular surface of the shielding cover. Alternatively, only one shielding film may be provided to cover the plurality of openings, that is, one large-sized shielding film may cover the plurality of openings.

In summary, the embodiment of the present disclosure provides a method for manufacturing a control module. By this method, the adhesive may be dropped between the IC and the printed circuit board through the dispensing hole of the shielding cover, in response to the shielding cover housing the IC inside being soldered onto the printed circuit board. Therefore, the IC can be effectively secured on the printed circuit board by soldering and adhesive bonding. The yield of the control module is improved.

Figure 12:
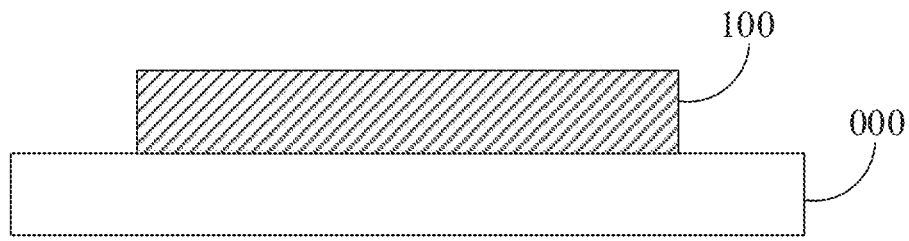
FIG. 12 is a schematic structural diagram of an electronic device according to an embodiment of the present disclosure.

Optionally, FIG. 12 is a schematic structural diagram of an electronic device according to an embodiment of the present disclosure. As shown in FIG. 12, the electronic device may include a base substrate 000, and the control module 100 as shown in any one of FIG. 1, FIG. 2, FIG. 6, FIG. 7, and FIG. 10. As shown in FIG. 12, the control module 100 may be disposed on a base substrate 000.

Optionally, the electronic device may be any product or component with a display function, such as a display apparatus, a mobile phone, a tablet, a television, a display, a laptop, a digital photo frame, or a navigator.

Figure 13:
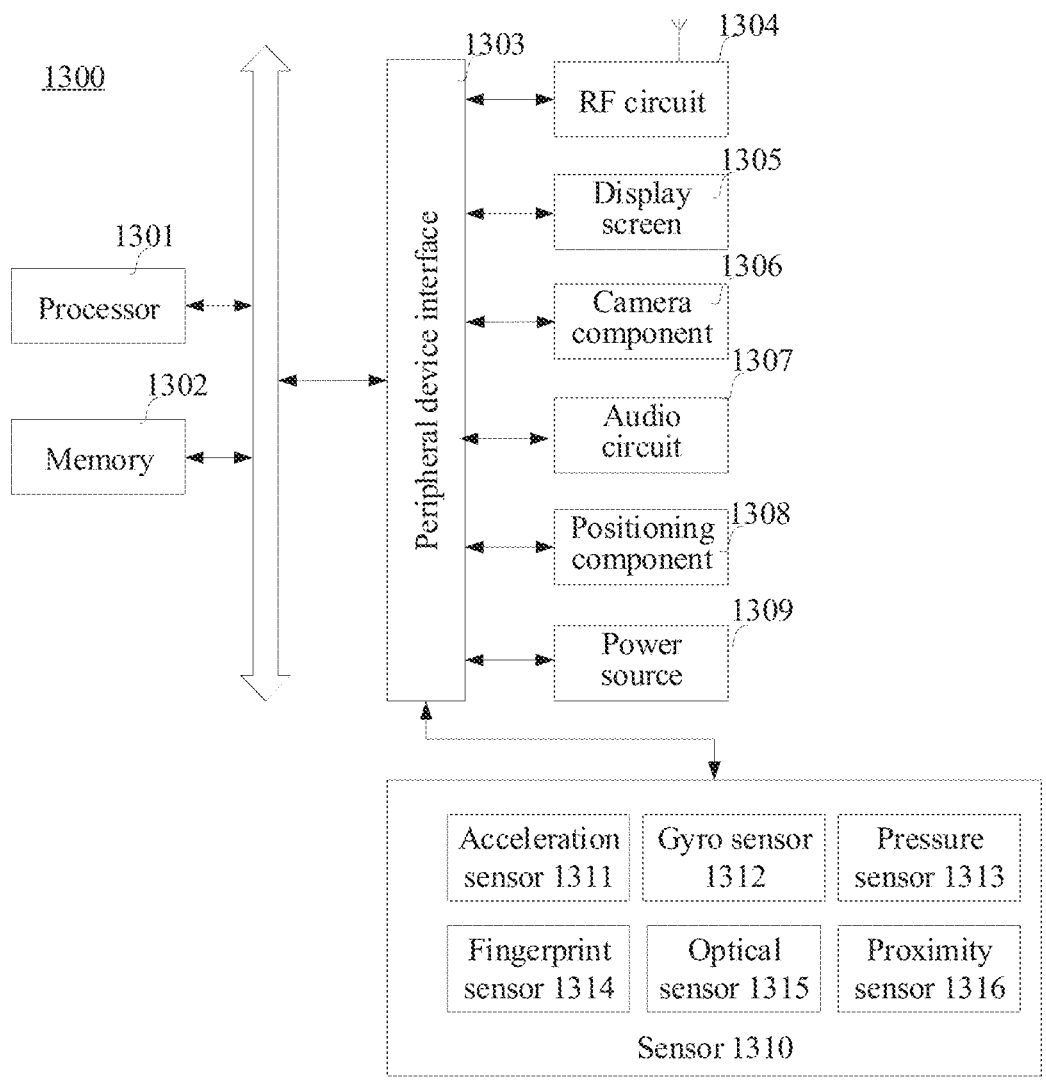
FIG. 13 is a structural block diagram of an electronic device according to an embodiment of the present disclosure.

FIG. 13 is a structural block diagram of an electronic device 1300 according to an exemplary embodiment of the present disclosure. The electronic device 1300 may also be called a UE (User Equipment), a portable terminal, a laptop terminal, a desk terminal, or the like. Generally, the electronic device 1300 includes: a processor 1301 and a memory 1302.

The processor 1301 may include one or more processing cores, such as a 4-core processor and an 8-core processor. The processor 1301 may be implemented by at least one hardware of a digital signal processing (DSP), a field-programmable gate array (FPGA), and a programmable logic array (PLA). The processor 1301 may also include a main processor and a coprocessor. The main processor is a processor configured to process the data in an awake state, and is also called a central processing unit (CPU). The coprocessor is a low-power-consumption processor configured to process the data in a standby state. In some embodiments, the processor 1301 may be integrated with a graphics processing unit (GPU), wherein the GPU is configured to render and draw the content that needs to be displayed by a display screen. In some embodiments, the processor 1301 may also include an Artificial Intelligence (AI) processor configured to process computing operations related to machine learning.

The memory 1302 may include one or more computer-readable storage mediums, which can be non-transitory. The memory 1302 may also include a high-speed random-access memory, and a non-volatile memory, such as one or more disk storage devices and flash storage devices.

In some embodiments, the electronic device 1300 also optionally includes: a peripheral device interface 1303 and at least one peripheral device. The processor 1301, the memory 1302, and the peripheral device interface 1303 may be connected by a bus or a signal line. Each peripheral device may be connected to the peripheral device interface 1303 by a bus, a signal line or a printed circuit board. Specifically, the peripheral device includes at least one of: a radio frequency circuit 1304, a touch display screen 1305, a camera 1306, an audio circuit 1307, a positioning component 1308 and a power source 1309.

The peripheral device interface 1303 may be configured to connect at least one peripheral device associated with an input/output (I/O) to the processor 1301 and the memory 1302. In some embodiments, the processor 1301, the memory 1302 and the peripheral device interface 1303 are integrated on the same chip or printed circuit board. In some other embodiments, any one or two of the processor 1301, the memory 1302, and the peripheral device interface 1303 may be configured on a separate chip or a printed circuit board, which is not limited in this embodiment.

The radio frequency circuit 1304 is configured to receive and transmit a radio frequency (RF) signal, which is also interpreted as an electromagnetic signal. The radio frequency circuit 1304 communicates with a communication network and other communication devices via the electromagnetic signal. The RF circuit 1304 converts the electrical signal into the electromagnetic signal for transmission, or converts the received electromagnetic signal into the electrical signal. Optionally, the RF circuit 1304 includes: an antenna system, an RF transceiver, one or more amplifiers, a tuner, an oscillator, a digital signal processor, a codec chipset, a subscriber identity module card, and the like. The RF circuit 1304 may communicate with other terminals via at least one wireless communication protocol. The wireless communication protocol includes, but not limited to, a metropolitan area network, various generations of mobile communication networks (2G, 3G, 4G, and 5G), a wireless local area network, and/or a wireless fidelity (Wi-Fi) network. In some embodiments, the RF circuit 1304 may also include near field communication (NFC) related circuits, which is not limited in the present disclosure.

The display screen 1305 is configured to display a user interface (UI). The UI may include graphics, text, icons, videos, and any combination thereof. Where the display screen 1305 is a touch display screen, the display screen 1305 is also capable of acquiring touch signals on or over the surface of the display screen 1305. The touch signal may be input into the processor 1301 as a control signal for processing. At this time, the display screen 1305 may also be configured to provide virtual buttons and/or virtual keyboards, which are also interpreted as soft buttons and/or soft keyboards. In some embodiments, one display screen 1305 may be disposed on the front panel of the electronic device 1300. In some other embodiments, at least two display screens 1305 may be disposed respectively on different surfaces of the electronic device 1300 or in a folded design. In further embodiments, the display screen 1305 may be a flexible display screen disposed on the curved or folded surface of the electronic device 1300. The display screen 1305 may have an irregular shape other than a rectangle. That is, the display screen 1305 may be an irregular-shaped screen. The display screen 1305 may be a liquid crystal display (LCD) screen, an organic light-emitting diode (OLED) screen or the like.

The camera component 1306 is configured to capture images or videos. Optionally, the camera component 1306 includes a front camera and a rear camera. Generally, the front camera is disposed on the front panel of the terminal, and the rear camera is disposed on the back of the terminal. In some embodiments, at least two rear cameras are disposed, respectively any one of a primary camera, a depth-of-field camera, a wide-angle camera, and a telephoto camera, to implement a background blurring function achieved by fusion of the main camera and the depth-of-field camera, panoramic shooting and virtual reality (VR) shooting functions achieved by fusion of the main camera and the wide-angle camera or other fusion shooting functions. In some embodiments, the camera component 1306 may also include a flashlight. The flashlight may be a mono-color temperature flashlight or a dual-color temperature flashlight. The dual-color temperature flashlight is a combination of a warm flashlight and a cold flashlight and can be intended to compensate for the light at different color temperatures.

The audio circuit 1307 may include a microphone and a speaker. The microphone is configured to collect sound waves of users and environment, and convert the sound waves into electrical signals and input the electrical signals into the processor 1301 for processing, or input into the RF circuit 1304 for voice communication. For the purpose of stereo acquisition or noise reduction, a plurality of microphones may be respectively disposed at different locations of the electronic device 1300. The microphone may also be an array microphone or an omnidirectional acquisition microphone. The speaker is configured to convert the electrical signals from the processor 1301 or the RF circuit 1304 into the sound waves. The speaker may be a conventional film speaker or a piezoelectric ceramic speaker. Where the speaker is the piezoelectric ceramic speaker, the electrical signal can be converted into not only human-audible sound waves but also the sound waves which are inaudible to humans for the purpose of ranging and the like. In some embodiments, the audio circuit 1307 may also include a headphone jack.

The positioning component 1308 is configured to position a current geographic location of the electronic device 1300 to implement navigation or a location-based service (LBS). The positioning component 1308 may be the United States' Global Positioning System (GPS), Russia's Global Navigation Satellite System (GLONASS), China's BeiDou Navigation Satellite System (BDS), and the European Union's Galileo.

The power source 1309 is configured to power up various components in the electronic device 1300. The power source 1309 may be alternating current, direct current, a disposable battery, or a rechargeable battery. Where the power source 1309 includes the rechargeable battery, the rechargeable battery may support wired charging or wireless charging. The rechargeable battery may also support the fast charging technology.

In some embodiments, the electronic device 1300 also includes one or more sensors 1310. The one or more sensors 1310 include, but not limited to, an acceleration sensor 1311, a gyro sensor 1312, a pressure sensor 1313, a fingerprint sensor 1314, an optical sensor 1315 and a proximity sensor 1316.

The acceleration sensor 1311 may detect magnitudes of accelerations on three coordinate axes of a coordinate system established by the electronic device 1300. For example, the acceleration sensor 1311 may be configured to detect components of a gravitational acceleration on the three coordinate axes. The processor 1301 may control the touch display screen 1305 to display a user interface in a landscape view or a portrait view based on a gravitational acceleration signal collected by the acceleration sensor 1311. The acceleration sensor 1311 may also be configured to collect motion data of a game or a user.

The gyro sensor 1312 may detect a body direction and a rotation angle of the electronic device 1300, and can cooperate with the acceleration sensor 1311 to collect a 3D motion of the user on the electronic device 1300. Based on the data collected by the gyro sensor 1312, the processor 1301 is capable of implementing functions of: motion sensing (such as changing the UI according to a user's tilt operation), image stabilization during shooting, game control, and inertial navigation.

The pressure sensor 1313 may be disposed on a side frame of the electronic device 1300 and/or a lower layer of the touch display screen 1305. Where the pressure sensor 1313 is disposed on the side frame of the electronic device 1300, a users holding signal to the electronic device 1300 may be detected. The processor 1301 can perform left-right hand recognition or quick operation based on the holding signal collected by the pressure sensor 1313. Where the pressure sensor 1313 is disposed on the lower layer of the touch display screen 1305, the processor 1301 controls an operable control on the UI based on a user's press operation on the touch display screen 1305. The operable control includes at least one of a button control, a scroll bar control, an icon control, and a menu control.

The fingerprint sensor 1314 is configured to collect a user's fingerprint. An identity of the user is identified by the processor 1301 based on the fingerprint collected by the fingerprint sensor 1314, or by the fingerprint sensor 1314 based on the collected fingerprint. Where the identity of the user is identified as being trusted, the processor 1301 allows the user to perform related sensitive operations, such as unlocking the screen, viewing encrypted information, downloading software, paying, and changing settings. The fingerprint sensor 1314 may be disposed on the front, back, or side of the electronic device 1300. Where the electronic device 1300 is provided with a physical button or a manufacturer's logo, the fingerprint sensor 1314 may be integrated with the physical button or the manufacturer's logo.

The optical sensor 1315 is configured to collect ambient light intensity. In one embodiment, the processor 1301 may control the display brightness of the touch display screen 1305 based on the ambient light intensity collected by the optical sensor 1315. Specifically, where the ambient light intensity is high, the display brightness of the touch display screen 1305 is increased; and where the ambient light intensity is low, the display brightness of the touch display screen 1305 is decreased. In another embodiment, the processor 1301 may also dynamically adjust shooting parameters of the camera component 1306 based on the ambient light intensity collected by the optical sensor 1315.

The proximity sensor 1316, also referred to as a distance sensor, is generally disposed on the front panel of the electronic device 1300. The proximity sensor 1316 is configured to capture a distance between the user and a front surface of the electronic device 1300. In one embodiment, where the proximity sensor 1316 detects that the distance between the user and the front surface of the electronic device 1300 gradually decreases, the processor 1301 controls the touch display screen 1305 to switch from a screen-on state to a screen-off state. Where the proximity sensor 1316 detects that the distance between the user and the front surface of the electronic device 1300 gradually increases, the processor 1301 controls the touch display screen 1305 to switch from the screen-off state to the screen-on state.

It will be understood by those skilled in the art that the structure shown in FIG. 13 does not constitute a limitation to the electronic device 1300, and may include more or less components than those illustrated, or combine some components or adopt different component arrangements.

It should be understood that "and/or" herein indicates three relationships. For example, A and/or B, can be interpreted as follows: A exists alone, A and B exist concurrently. B exists alone. The symbol "/" generally indicates an "or" relationship between the contextual objects. As used herein, the singular forms "a," "an," and "the" include both singular and plural referents unless the context clearly dictates otherwise.

Described above are merely exemplary embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A control module, comprising:
   a printed circuit board;
   an integrated circuit (IC) disposed on the printed circuit board; and
   a shielding cover soldered onto the printed circuit board and housing the IC inside;
   wherein the shielding cover is provided with a dispensing hole for adhesive dispensing,
   wherein the control module further comprises a shielding film covering an opening, the opening comprising the dispensing hole.

2. The control module according to claim 1, wherein the shielding cover comprises a top plate and a side plate, one end of the side plate being connected to the top plate and the other end of the side plate being soldered onto the printed circuit board; wherein the dispensing hole is disposed in the top plate.

3. The control module according to claim 2, wherein an orthographic projection of the dispensing hole on the printed circuit board is overlapped with an orthographic projection of the IC on the printed circuit board.

4. The control module according to claim 1, wherein the dispensing hole is in the shape of a circle, a square, or a rhombus.

5. The control module according to claim 1, wherein the shielding cover is further provided with an observation hole for observation.

6. The control module according to claim 5, wherein an orthographic projection of the IC on the printed circuit board is in the shape of a rectangle, and orthographic projections of the observation hole and the dispensing hole on the printed circuit board fall on two opposite sides or at two opposite corners of the rectangle.

7. The control module according to claim 1, wherein an orthographic projection of the opening on the printed circuit board is within an orthographic projection of the shielding film on the printed circuit board.

8. The control module according to claim 1, wherein the shielding cover is further provided with at least one rectangular surface and a plurality of openings formed in a same with the at least one rectangular surface;
   wherein a plurality of shielding films are provided, wherein the plurality of shielding films covering the plurality of openings, and the plurality of openings one-to-one corresponding to the plurality of shielding films; or a single shielding film is provided, the single shielding film covering the plurality of openings.

9. The control module according to claim 8, wherein
   the shielding cover is further provided with an observation hole for observation, and an orthographic projection of the IC on the printed circuit board is in the shape of a rectangle; wherein orthographic projections of the observation hole and the dispensing hole on the printed circuit board fall on two opposite sides or at two opposite corners of the rectangle;
   the dispensing hole is in the shape of a circle, a square, or a rhombus, and an orthographic projection of the opening on the printed circuit board is within an orthographic projection of the shielding film on the printed circuit board;

a material of the shielding film comprises a flexible metal material, a thickness of the flexible metal material being less than a thickness threshold; a material of the shielding cover comprises a metal material; the printed circuit board comprises a flexible printed circuit (FPC); and the IC comprises a touch IC; and an adhesive used in the adhesive dispensing comprises a hot-melt adhesive; and the adhesive dispensing comprises: dispensing the adhesive between the printed circuit board and the IC to bond the printed circuit board to the IC.

10. The control module according to claim 1, a material of the shielding film comprises a flexible metal material, a thickness of the flexible metal material being less than a thickness threshold.

11. The control module according to claim 1, wherein a material of the shielding cover comprises a metal material.

12. The control module according to claim 1, wherein the printed circuit board comprises a flexible printed circuit (FPC); and the IC comprises a touch IC.

13. The control module according to claim 1, wherein an adhesive used in the adhesive dispensing comprises a hot-melt adhesive.

14. The control module according to claim 1, wherein the adhesive dispensing comprises: dispensing an adhesive between the printed circuit board and the IC to bond the printed circuit board to the IC.

15. An electronic device, comprising: a base substrate, and the control module as defined in claim 1, the control module being disposed on the base substrate.

16. A method for manufacturing a control module, comprising:

providing a printed circuit board;

arranging an integrated circuit (IC) on the printed circuit board;

soldering a shielding cover onto the printed circuit board, the shielding cover housing the IC inside and being provided with a dispensing hole for adhesive dispensing; and dispensing an adhesive between the IC and the printed circuit board through the dispensing hole.

17. The method according to claim 16, wherein the shielding cover comprises a top plate and a side plate, one end of the side plate being connected to the top plate and the other end of the side plate being soldered onto the printed circuit board; wherein the dispensing hole is disposed in the top plate.

18. The method according to claim 17, wherein an orthographic projection of the dispensing hole on the printed circuit board is overlapped with an orthographic projection of the IC on the printed circuit board.

19. The method according to claim 16, wherein the dispensing hole is in the shape of a circle, a square, or a rhombus.

* * * * *